US012764914B2

(12) United States Patent
Lee et al.

(10) Patent No.: US 12,764,914 B2
(45) Date of Patent: Oct. 13, 2026

(54) HOUSING FOR A POWER CONVERSION SYSTEM

(71) Applicant: SK ON CO., LTD., Seoul (KR)

(72) Inventors: Yun Nyoung Lee, Daejeon (KR); So Yeon Choi, Daejeon (KR); Dong Hwa Han, Daejeon (KR)

(73) Assignee: SK On Co., Ltd., Seoul (KR)

( * ) Notice: Subject to any disclaimer, the term of this patent is extended or adjusted under 35 U.S.C. 154(b) by 408 days.

(21) Appl. No.: 18/505,752

(22) Filed: Nov. 9, 2023

(65) Prior Publication Data

US 2024/0188259 A1 Jun. 6, 2024

(30) Foreign Application Priority Data

Dec. 6, 2022 (KR) ........................ 10-2022-0169050

(51) Int. Cl.
*H05K 7/20* (2006.01)
*H02M 7/00* (2006.01)
*H05K 7/14* (2006.01)

(52) U.S. Cl.
CPC ........ *H05K 7/20909* (2013.01); *H02M 7/003* (2013.01); *H05K 7/1432* (2013.01); *H05K 7/20145* (2013.01)

(58) Field of Classification Search
CPC ........... H05K 7/14325; H05K 7/20145; H05K 7/20909; H05K 5/0213; H05K 5/0217; H05K 7/1432; H05K 7/20172; H02M 1/00; H02M 7/003; H02B 3/00; H02B 11/167
USPC .......................................................... 174/520
See application file for complete search history.

(56) References Cited

U.S. PATENT DOCUMENTS 11,342,731 B1 * 5/2022 Thompson ......... H05K 7/20145
2001/0007307 A1 * 7/2001 Karpisek ................ B65D 25/56 206/386
2004/0040313 A1 * 3/2004 Kurokawa ................ F02C 7/20 60/796
2018/0249595 A1 * 8/2018 Ashbaugh .......... H05K 7/20909

FOREIGN PATENT DOCUMENTS

CN 216085157 U 3/2022
EP 2849552 A2 3/2015
EP 3611814 A1 2/2020
JP H07-211304 A 8/1995
KR 10-2022-0020709 A1 2/2022
KR 10-2022-0137441 A1 10/2022
WO 2022/211229 A1 10/2022

OTHER PUBLICATIONS

KIPO, Appl. 10-2022-0169050; Office Action, Apr. 16, 2026.

* cited by examiner

*Primary Examiner* — Timothy J Thompson
*Assistant Examiner* — Michael F Mcallister
(74) *Attorney, Agent, or Firm* — Jones Day

(57) ABSTRACT

A power conversion system and a housing of the power conversion system are disclosed. In an embodiment of the disclosed technology, a housing may include a case that includes a structure that allows a forklift to easily hold the housing so that the system can be safely carried.

20 Claims, 10 Drawing Sheets

HOUSING FOR A POWER CONVERSION SYSTEM

CROSS-REFERENCE TO RELATED APPLICATIONS

This patent document claims the priority and benefits of Korean Patent Application No. 10-2022-0169050 filed on Dec. 6, 2022, the entire contents of which are incorporated by reference as part of the disclosure of this application.

TECHNICAL FIELD

The disclosed technology relates to a power conversion system, and more particularly, to a power conversion system that can be moved safely.

BACKGROUND

A power conversion system may be used to connect a battery module for power storage to an external system. When the power conversion system is connected to the battery module, the power conversion system is moved to a place close to the battery module. To move the power conversion system safely and easily, a different design for the power conversion system may be required.

SUMMARY

The disclosed technology can be implemented in some embodiments to provide a power conversion system that has a structure for allowing a forklift truck to easily lift and move the power conversion system.

In one aspect, a housing may include a case structured to provide an accommodation space and including a front case forming a front face of the case; and a duct positioned in the accommodation space and facing the front case, the duct including a duct hollow that is open towards a forward direction, wherein the front case includes a front case body forming the front face of the case; and a forklift opening formed on the front case body and positioned in front of the duct, wherein the duct further includes a duct upper part disposed behind the forklift opening, the duct upper part including a duct upper plate extending rearward and forming an upper surface; and a duct side part including a duct side plate extending downward from a side of the duct upper part and a board seating portion positioned on the duct side plate and concave toward the duct hollow.

In another aspect, a power conversion system may include a case structured to include an accommodation space and including a front case forming a front face of the case; a duct positioned in the accommodation space and facing the front case, the duct including a duct hollow that is open towards a forward direction; and a component accommodated in at least one of the case or the duct, wherein the front case includes a front case body forming the front face; and a forklift opening formed on the front case body and positioned in front of the duct, wherein the duct includes a duct upper part disposed behind the forklift opening, the duct upper part including a duct upper plate extending rearward and forming an upper surface; and a duct side part including a duct side plate extending downward from a side of the duct upper part and a board seating portion positioned on the duct side plate and concave toward the duct hollow.

The disclosed technology can be implemented in some embodiments to provide a power conversion system having a structure that can be easily carried by a forklift truck.

The power conversion system implemented based on some embodiments of the disclosed technology can be widely applied in the field of green technology to prevent climate change by suppressing air pollution and greenhouse gas emissions.

BRIEF DESCRIPTION OF THE DRAWINGS

The accompanying drawings illustrate examples of embodiments of various technical features disclosed in the disclosure.

DETAILED DESCRIPTION

Reference will now be made in detail to embodiments of the disclosed technology, examples of which are illustrated in the accompanying drawings. However, the following description is merely an example and does not intend to limit the disclosed technology to a specific implementation.

Figure 1:
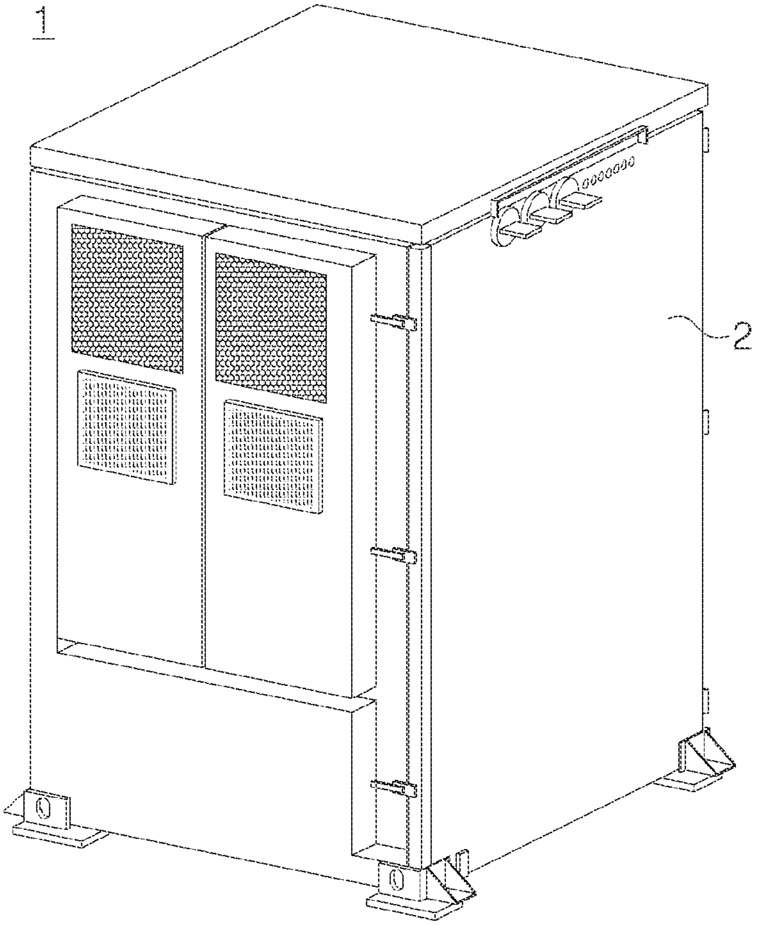
FIG. 1 is a perspective view of an example of a power storage system based on an embodiment of the disclosed technology.
Figure 2:
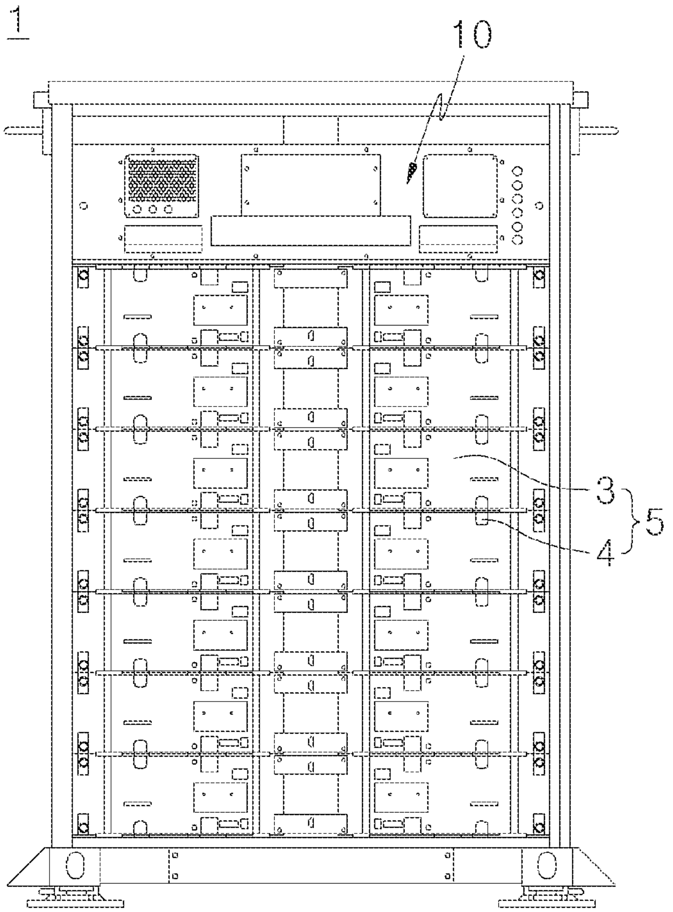
FIG. 2 is a front view of an example of a power storage system based on an embodiment of the disclosed technology.

FIG. 1 is a perspective view of an example of a power storage system based on an embodiment of the disclosed technology. FIG. 2 is a front view of an example of a power storage system based on an embodiment of the disclosed technology.

Referring to FIGS. 1 and 2, a power storage system 1 may include a cabinet 2. It is to be noted that a front cover of the cabinet 2 is omitted from FIG. 2.

The cabinet 2 may include side covers on both sides, a rear cover disposed on a rear side, an upper cover disposed on an upper side, a lower cover disposed on a lower side, and a front cover disposed on a front side.

A heating, ventilation, & air conditioning (HVAC) system may be disposed on the front cover. The HVAC system may control an environment inside the cabinet 2.

The power storage system 1 may include a battery pack 5 and a power conversion system 10. The cabinet 2 may accommodate and protect the power conversion system 10 and the battery pack 5.

The battery pack 5 may include a battery rack 4 and a battery module 3 held by the battery rack 4. In various implementations, the battery rack 4 may accommodate a plurality of battery modules 3. The battery rack 4 may have a tower stack structure that allows the plurality of battery modules 3 to be arranged in a vertical direction.

The battery module 3 may include at least one battery cell. The battery cell may be a secondary battery that can be recharged. That is, the battery module 3 may be a battery capable of charging and discharging. The plurality of battery modules 3 may be accommodated in the battery rack 4. The plurality of battery modules 3 may include a stack of battery modules 3 stacked vertically.

The power conversion system 10 may be connected to the battery pack 5. For example, the power conversion system 10 may be connected to the battery module 3. For example, the power conversion system 10 may be positioned on the battery pack 5.

The power conversion system 10 may be connected to an external power source. The power conversion system 10 may receive power from the external power source and transfer the power to the one or more battery modules 3 in the battery pack 5. During this process, the power conversion system 10 may convert electric energy received from the external power source from one form to another and transfer or provide the converted electric energy to the one or more battery modules 3. When a battery module 3 receives power or electric energy from the power conversion system 10, the battery module 3 may be charged and store the received power or energy.

The power conversion system 10 may be connected to a power grid or a power consuming device. The power conversion system 10 may receive power from one or more battery modules 3 in the battery pack 5 and transfer the power to the power grid or the power consuming device. In this process, the power conversion system 10 may convert electric energy received from the battery module 3 from one form to another and transfer or provide it to the power grid or the power consuming device. When the power conversion system 10 receives power from the battery module 3, the battery module 3 may be discharged.

The power conversion system 10 may include a plurality of components for modifying the characteristics of the received power (e.g., converting electric energy from one form to another). In various implementations, the power conversion system 10 may be very heavy due to components disposed inside the power conversion system 10.

Due to the weight of the power conversion system 10, it may be difficult for a worker or operator to load the power conversion system 10 on the battery pack 5 when assembling the power storage system 1. A crane or a forklift truck may be used to move and/or load the power conversion system 10 to the top of the battery pack 5.

When the power conversion system 10 is moved by using a crane, the power conversion system 10 may be connected to the crane by using an installation ring on the power conversion system 10. In this case, it may take time and efforts to connect the installation ring to the power conversion system 10.

When the power conversion system 10 is moved using a forklift truck, the power conversion system 10 may be loaded on a forklift of the forklift truck, and the forklift truck may be operated to move the power conversion system 10 to the top of the battery pack 5. In this case, it may be difficult to carry out the loading process of the power conversion system 10 on the forklift.

Accordingly, in carrying the power conversion system 10 using the forklift truck, the power conversion system 10 loaded on the forklift truck needs to remain immobilized. For example, the power conversion system 10 loaded on forks of the forklift or forklift truck can be attached or fastened to a portion of the forklift or forklift truck (e.g., forks of the forklift or forklift truck), and after the forklift or forklift truck reaches a desired destination, the power conversion system 10 is detached or separated from the portion (e.g., forks) of the forklift or forklift truck.

Figure 3:
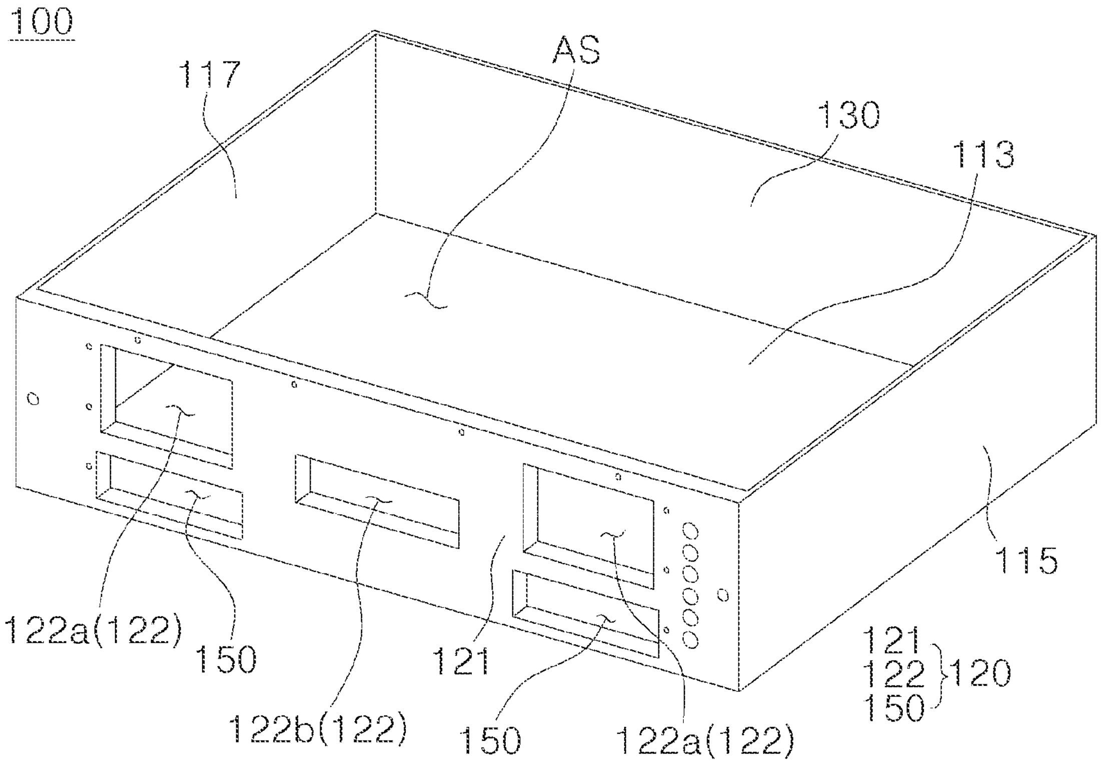
FIG. 3 illustrates a case implemented based on an embodiment of the disclosed technology.
Figure 12:
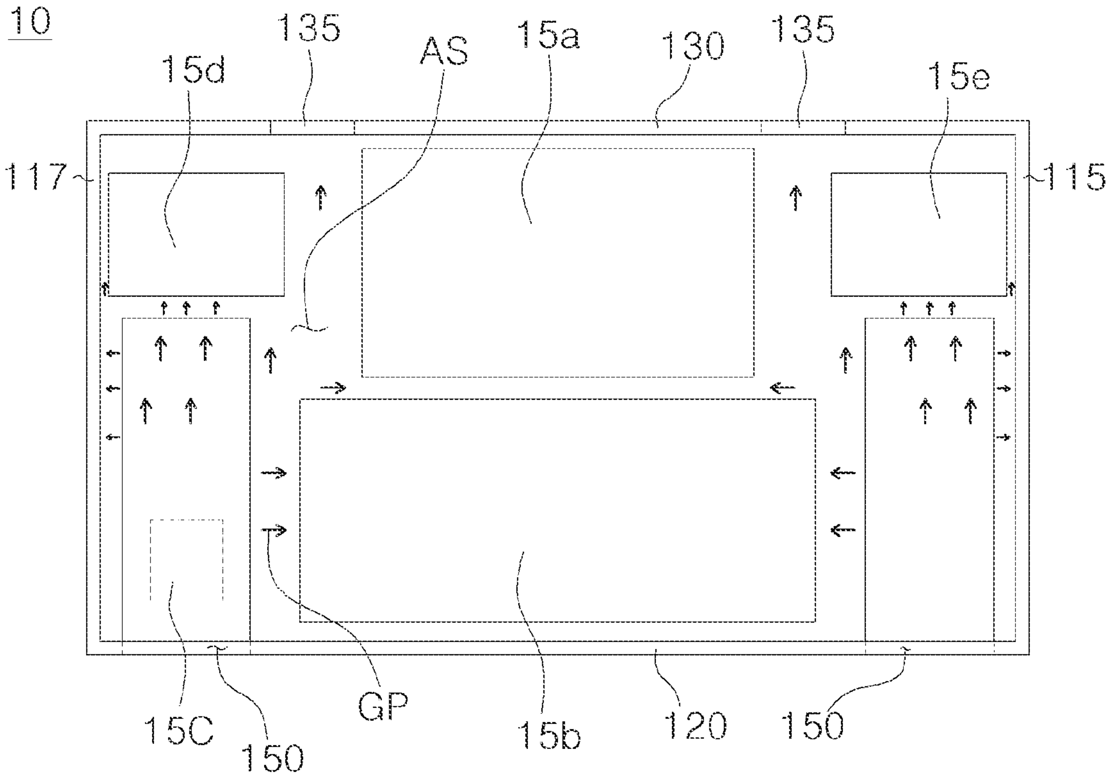
FIG. 12 illustrates a gas flow path formed in a power conversion system based on an embodiment of the disclosed technology.

Referring to FIG. 3, the power conversion system 10 in FIG. 2 may include a case 100 that includes an accommodation space AS therein. For example, the accommodation space AS is an inner space of the case 100 to enclose various circuits and components of the power conversion system 10 as illustrated in FIG. 12. It is to be noted that FIG. 3 does not show an upper surface of the case 100 for clarity and convenience of illustration. In some implementations, the case 100 may be referred to as "power conversion system case."

The case 100 may include a front case 120. The front case 120 may form a front face of the case 100. The front case 120 may include a front case body 121. In some implementations, the front case body 121 may form a plate shape.

The front case 120 may include a front vent (e.g., ventilation structure) 122. The front vent 122 may be an opening formed in the front case body 121. The front vent 122 may connect to or communicate with a front portion and a rear portion of the front case body 121.

In some implementations, a plurality of front vents 122 may be provided. For example, the front vent 122 may include a corner vent 122*a* and a central vent 122*b*. In some implementations, a plurality of corner vents 122*a* may be provided. For example, the two corner vents 122*a* may be respectively positioned in upper left and upper right corners of the front case body 121. The central vent 122*b* may be an opening formed in the center portion of the front case body 121.

The front case 120 may include a forklift opening 150. In FIG. 3, the forklift opening 150 may be briefly illustrated for convenience of description. The forklift opening 150 may be an opening formed in the front case body 121. The forklift opening 150 may connect to or communicate with a duct 200 (see FIG. 4). For example, the forklift opening 150 may be positioned in front of the duct 200 (see FIG. 4). This is a difference between the forklift opening 150 and the front vent 122.

This forklift opening can be used by the forklift or forklift truck to carry and move the power conversion system 10 as a separate module from a power storage system 1 or to carry and move the entire power storage system 1 in which the power conversion system 10 and battery pack 5 are installed. In some implementations, the forklift opening 150 can be used when the power conversion system 10 is loaded on the forklift or forklift truck, a portion of the forklift or forklift truck (e.g., forks of the forklift or forklift truck) can be inserted into the power conversion system 10 through the forklift opening 150, and after the forklift or forklift truck reaches a desired destination, the portion (e.g., forks) of the forklift or forklift truck is extracted from the power conversion system 10. In some implementations, the power storage system 1, which includes the power conversion system 10 and the battery pack 5 is loaded on the forklift or forklift truck. When the power storage system 1 is loaded on the forklift or forklift truck, the portion of the forklift or forklift truck (e.g., forks of the forklift or forklift truck) can be inserted into the power conversion system 10 through the forklift opening 150, and after the forklift or forklift truck reaches a desired destination, the portion (e.g., forks) of the forklift or forklift truck is extracted from the power conversion system 10.

A plurality of forklift openings 150 may be provided. For example, two forklift openings 150 may be provided. The two forklift openings 150 may be adjacent to a first side and a second side of the front case 120, respectively.

The case 100 may include a rear case 130. The rear case 130 may form a rear face of the case 100. The rear case 130 may be disposed behind the front case 120.

The case 100 may include a lowercase 113. The lowercase 113 may form a bottom surface of the case 100. A front end of the lower case 113 may be coupled or connected to a lower end of the front case 120. A rear end of the lower case 113 may be coupled or connected to a lower end of the rear case 130.

The case 100 may include a first side case 115 and a second side case 117. The side cases 115 and 117 may refer to at least one of the first side case 115 or the second side case 117. The side cases 115 and 117 may form a shape that extends from the front end to the rear and leads to the rear end.

The first side case 115 may form a first side surface of the case 100. The first side case 115 may be connected to the first side of the front case 120. The second side case 117 may form a second side surface of the case 100. The second side case 117 may be connected to the second side of the front case 120.

Figure 4:
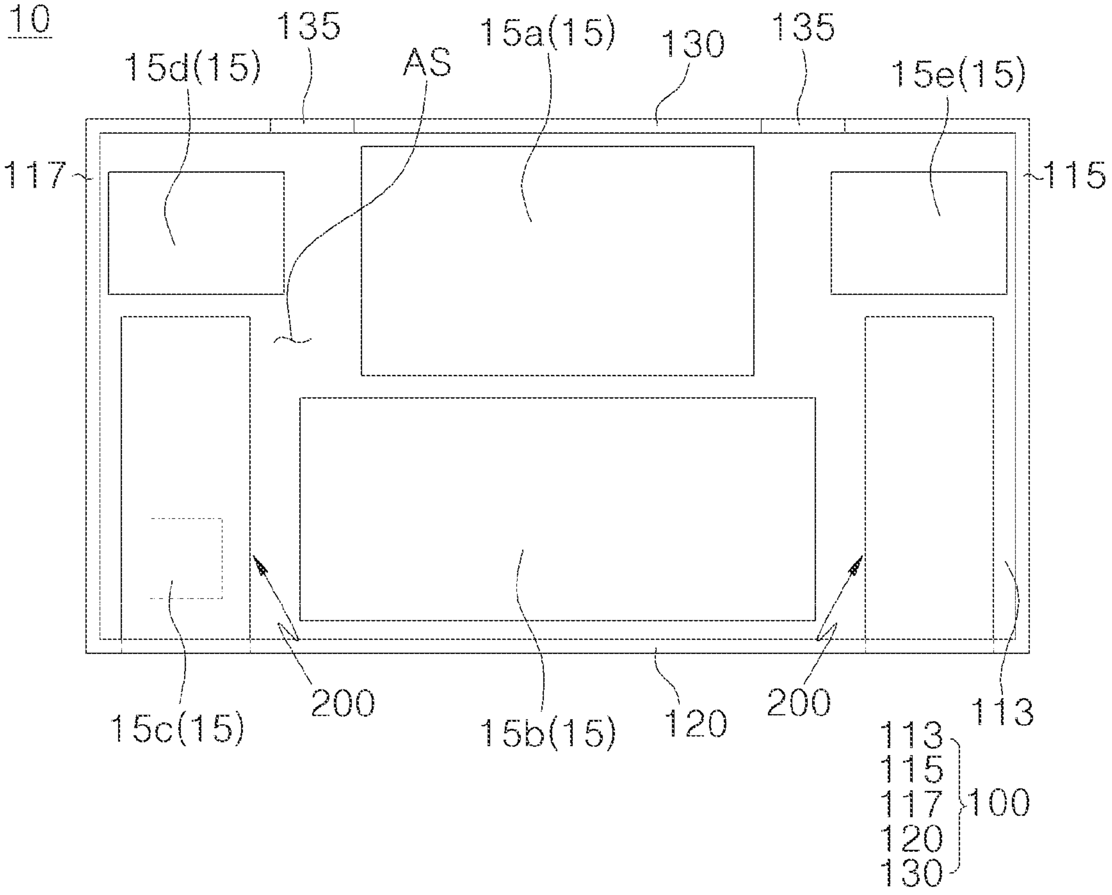
FIG. 4 is a plan view of an example of a power conversion system based on an embodiment of the disclosed technology.

FIG. 4 is a plan view of an example of a power conversion system based on an embodiment of the disclosed technology. FIG. 4 illustrates the power conversion system 10 when viewed from above in a state in which the upper surface of the case 100 (see FIG. 3) is removed.

Referring to FIG. 4, the power conversion system 10 may include a fan 135. The fan 135 may be connected or coupled to the rear case 130 or positioned or installed in the rear case 130.

The power conversion system 10 may include the duct 200. The duct 200 may be accommodated in the case 100. For example, the duct 200 may be positioned in the accommodation space AS formed in the case 100. The duct 200 may be positioned behind the front case 120. For example, the duct 200 may be positioned behind the forklift opening 150 (see FIG. 3). The duct 200 may be fixed to or coupled to the case 100.

The duct 200 may form a forward open hollow. The hollow formed in the duct 200 may connect to or communicate with the forklift opening 150 (see FIG. 3). For example, a front portion of the duct 200 may face the forklift opening 150 (see FIG. 3).

The power conversion system 10 may include a component 15. The component 15 may be accommodated in the case 100. In some implementations, the component 15 may be positioned in the accommodating space AS formed in the case 100. In an example, the component 15 may be accommodated in the duct 200. In some implementations, the term "housing" may be used to indicate the case 100, or the duct 200, or the combination of the case 100 and the duct 200.

The component 15 may be used to convert electric energy provided to the power conversion system 10 from one form to another. In an implementation, the component 15 may be used to convert alternating current (AC) into direct current (DC) and vice versa. In another implementation, the component 15 may be used to change the voltage or frequency of the current. In another implementation, the component 15 may manage power provided to or provided by the power conversion system 10.

In some implementations, the component 15 may include a plurality of components 15. For example, the component 15 may include a first component **15*a* and a second component 15*b* disposed in a center portion of the accommodation space AS (e.g., a center in a transverse direction in the accommodation space AS). The first component 15*a* may be disposed behind the second component 15*b*. The first component 15*a* may face the rear case 130. The second component 15*b* may face the front case 120**.

The second component **15*b* may include an element with a relatively large amount of heat generation. A cooling air flow provided from a heating, ventilation, and air conditioning (HVAC) system disposed on the front cover of the cabinet 2 (see FIG. 1) may cool the front case 120 and may pass through the central vent 122*b* (see FIG. 3) and be introduced into the inside of the case 100. The second component 15*b* may be easily cooled by the cooling air flow introduced through the central vent 122*b* (see FIG. 3**).

For example, the component 15 may include a third component **15*c*. The third component 15*c* may be accommodated in the duct 200. In FIG. 4, the third component 15*c* may be covered with the duct 200 and may not be visible (in FIG. 4, the third component 15*c* is indicated by a dotted line). The third component 15*c* may be detachably coupled to the duct 200**.

A battery management system (BMS) board may frequently require maintenance and/or debugging. When the third component **15*c*** is the BMS board, maintenance and/or debugging of the BMS board can be easily performed.

For example, the component 15 may include a fourth component **15*d* and a fifth component 15*e*. The fourth component 15*d* and the fifth component 15*e* may face the rear case 130. The first component 15*a* may be disposed between the fourth component 15*d* and the fifth component 15*e*. The fourth component 15*d* and the fifth component 15*e* may be positioned behind the two ducts 200**, respectively.

The fourth component **15*d* and the first component 15*a* may be spaced apart from each other. A gap formed between the fourth component 15*d* and the first component 15*a* may be positioned in front of the fan 135**.

The fifth component **15*e* and the first component 15*a* may be spaced apart from each other. A gap formed between the fifth component 15*e* and the first component 15*a* may be positioned in front of the fan 135**.

Figure 5:
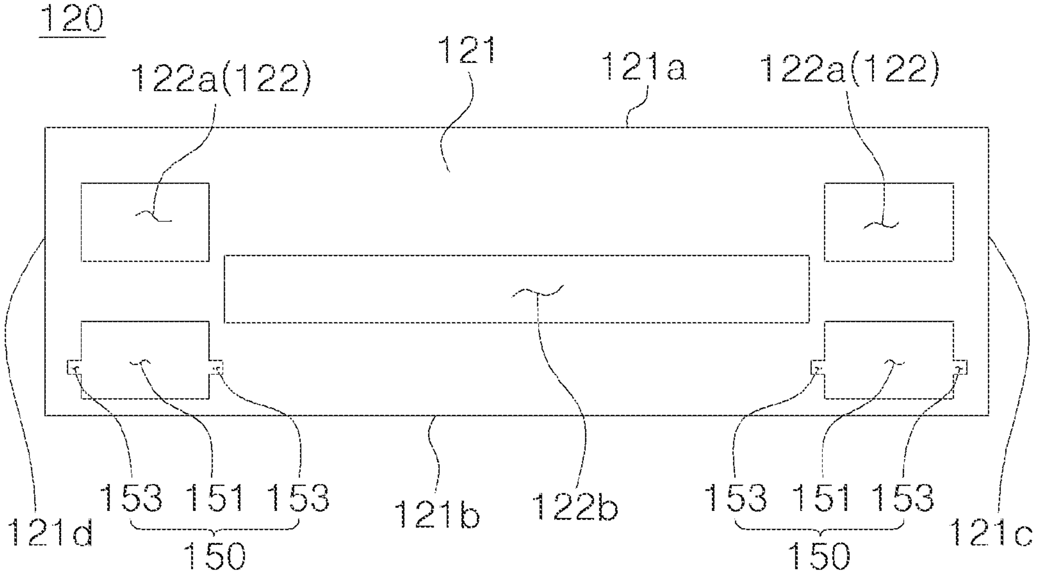
FIG. 5 illustrates a front case implemented based on an embodiment of the disclosed technology.

FIG. 5 illustrates an example of a front case based on an embodiment of the disclosed technology. Specifically, FIG. 5 shows the front face of the front case 120.

Referring to FIG. 5, the front case 120 may include a front case upper end **121*a*. The front case upper end 121*a* may indicate an upper end of the front case body 121. The front case upper end 121*a* may be connected or coupled to the upper surface of the case 100 (see FIG. 3**).

The front case 120 may include a front case lower end **121*b*. The front case lower end 121*b* may indicate a lower end of the front case body 121. The front case lower end 121*b* may be connected or coupled to the front end of the lower case 113 (see FIG. 3**).

The front case 120 may include a front case first end **121*c*. The front case first end 121*c* may be an end formed on the first side of the front case body 121. The front case first end 121*c* may be referred to as a "front case first side". The front case first end 121*c* may be connected or coupled to a front end of the first side case 115 (see FIG. 3**).

The front case 120 may include a front case second end **121*d*. The front case second end 121*d* may be an end formed on the second side of the front case body 121. The front case second end 121*d* may be referred to as "front case second side." The front case second end 121*d* may be connected or coupled to a front end of the second side case 117 (see FIG. 3**).

The forklift opening 150 may include a forklift entry/exit unit 151. The forklift entry/exit unit 151 may be a part where forks of the forklift or forklift truck enters and exits. That is, the forks of the forklift or forklift truck may enter and exit through the forklift entry/exit unit 151. The forklift entry/exit unit 151 may be positioned in front of a duct hollow 205 (see FIG. 7).

The forklift opening 150 may include a board entry/exit unit 153. The board entry/exit unit 153 may connect to or communicate with the hollow formed in the duct 200 (see FIG. 4). The third component 15*c* (see FIG. 4) may be coupled or attached to the duct 200 (see FIG. 4) or separated or detached from the duct 200 (see FIG. 4) through the board entry/exit unit 153. The board entry/exit unit 153 may be positioned in front of a board seating portion 223 (see FIG. 7).

For example, the forks of the forklift or forklift truck may be inserted into the forklift entry/exit unit 151 and enter the inside of the duct 200 (see FIG. 4). After the forks of the forklift or forklift truck are inserted into the duct 200 (see FIG. 4), the forklift truck may operate, and the power conversion system 10 (see FIG. 2) may move. Afterwards, the forks of the forklift or forklift truck may be removed or extracted from the duct 200 (see FIG. 4) and may exit the forklift entry/exit unit 151.

After the forks of the forklift or forklift truck are removed or extracted from the duct 200 (see FIG. 4), the third component 15*c* (see FIG. 4) may be coupled to the duct 200 (see FIG. 4) through the board entry/exit unit 153. After the third component 15*c* (see FIG. 4) is separated from the duct 200 (see FIG. 4), the forks of the forklift or forklift truck may enter or may be inserted into the duct 200 (see FIG. 4).

Figure 6:
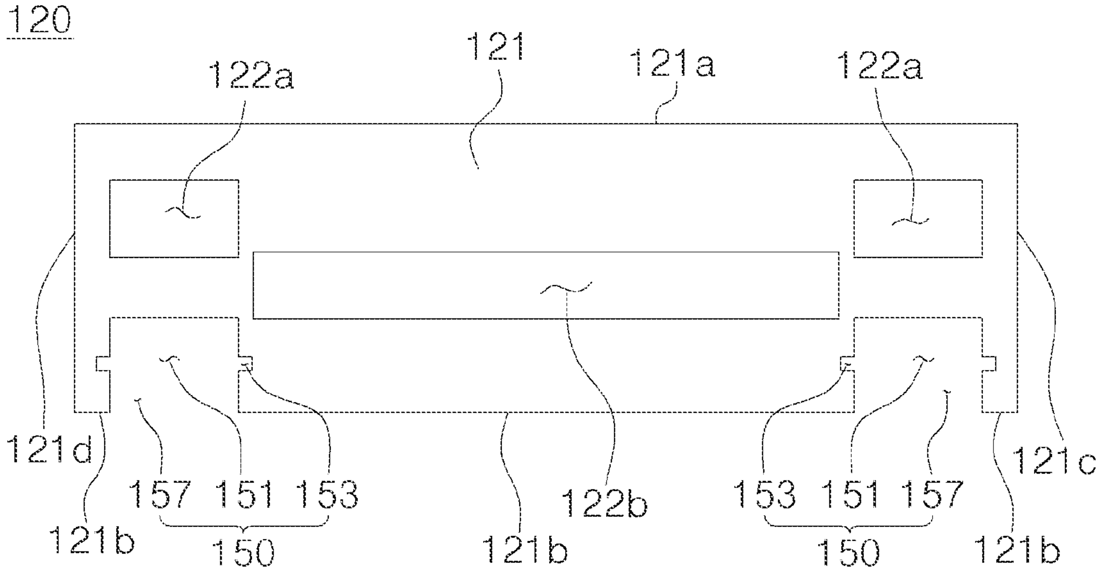
FIG. 6 illustrates an example of a front case with an entry opening.

FIG. 6 illustrates a front case with an entry opening. In FIG. 6, the front face of the front case 120 may be observed.

Referring to FIG. 6, the forklift opening 150 may include an entry opening 157. The entry opening 157 may be open in a downward direction. In other words, the forklift entry/exit unit 151 may be open in a downward direction. The entry opening 157 may be formed in the front case lower end 121*b*. The forks of the forklift or forklift truck may pass through the entry opening 157 below the entry opening 157 and may be positioned at the forklift entry/exit unit 151.

Figure 7:
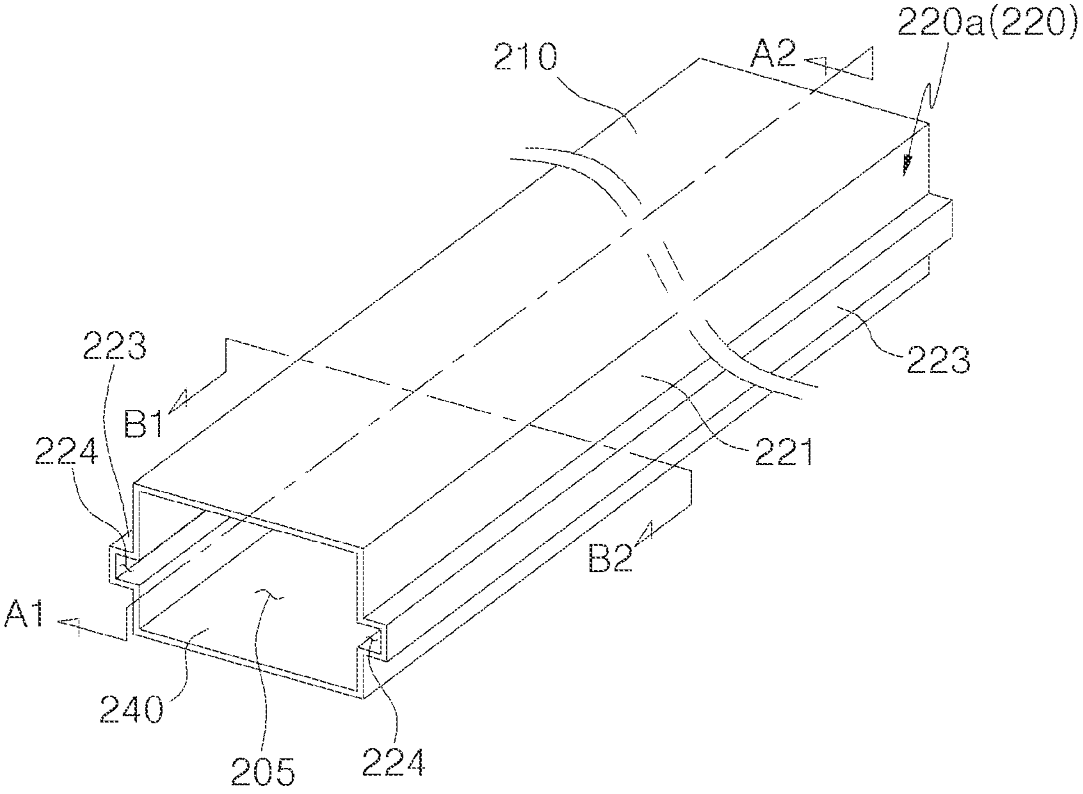
FIG. 7 is a perspective view of a duct implemented based on an embodiment of the disclosed technology.
Figure 8:
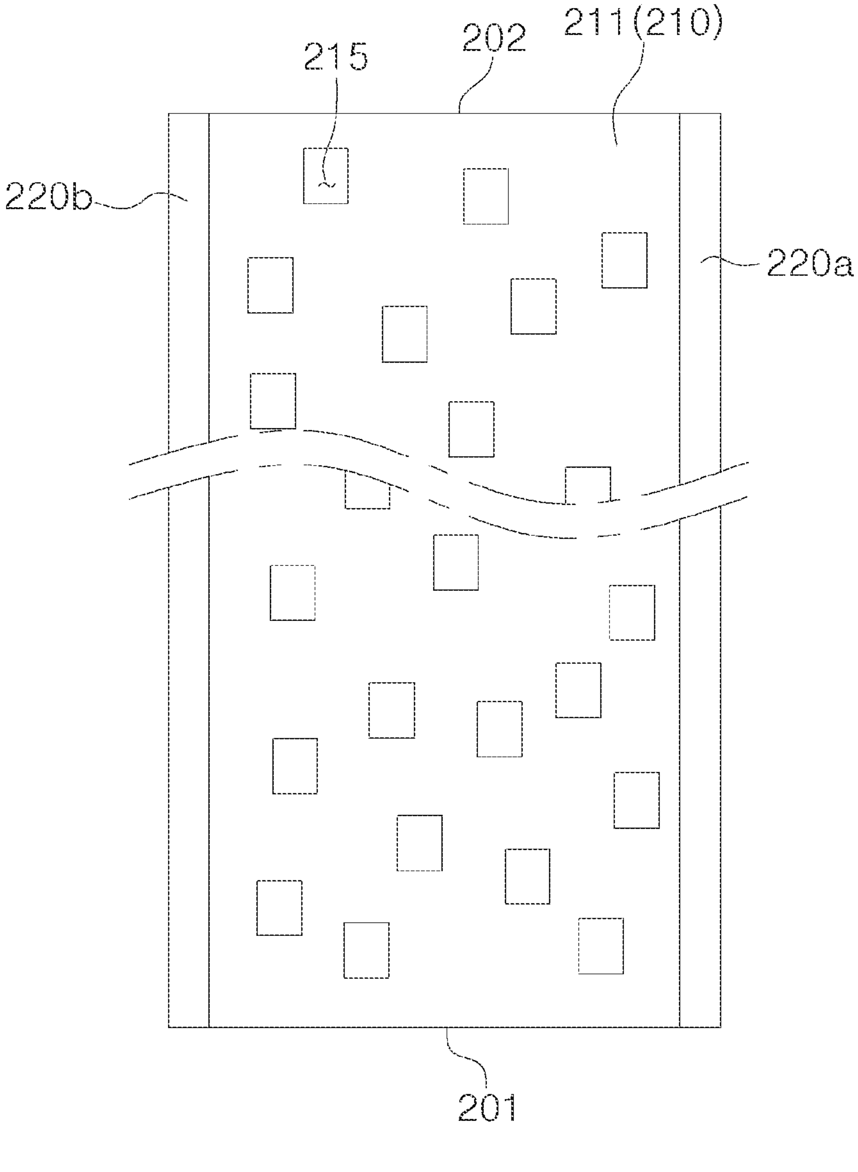
FIG. 8 illustrates an example of a duct of FIG. 7 when viewed from above.

FIG. 7 is a perspective view of an example of a duct based on an embodiment of the disclosed technology. FIG. 8 illustrates a duct of FIG. 7 when viewed from above.

Referring to FIGS. 7 and 8, the duct 200 may form a shape that extends in a rearward direction from the front end and leads to the rear end. For example, the duct 200 may include a duct front face 201. The duct front face 201 may be a front end of the duct 200. For example, the duct 200 may include a duct rear face 202. The duct rear face 202 may be a rear end of the duct 200.

The duct 200 may include a duct upper part 210. The duct upper part 210 may form an upper surface of the duct 200. When the power conversion system 10 (see FIG. 2) is loaded on the forklift entering the inside of the duct 200, the forklift may be positioned under the duct upper part 210.

When the power conversion system 10 (see FIG. 2) is loaded on the forklift that has entered or has been inserted into the inside of the duct 200, the load of the power conversion system 10 (see FIG. 2) may be transferred to the forklift through the duct upper part 210.

The duct upper part 210 may include a duct upper plate 211. The duct upper plate 211 may extend in a rearward direction from the duct front face 201 and lead to the duct rear face 202.

The duct upper part 210 may include at least one duct upper opening 215. The duct upper opening 215 may be an opening formed on the duct upper plate 211. The duct upper opening 215 may be connected to an upper surface and a lower surface of the duct upper plate 211. For convenience of illustration, FIG. 8 does not show the duct upper opening 215. The duct upper opening 215 may connect to or communicate with the duct hollow 205 and the accommodation space AS (see FIG. 3).

The duct 200 may include a duct side part 220. The duct side part 220 may form a shape extending in a downward direction from both sides of the duct upper part 210, respectively. In some implementations, a plurality of duct side parts 220 may be provided.

For example, the duct side part 220 may include a first duct side part 220*a*. The first duct side part 220*a* may form a shape extending in a downward direction from a first side of the duct upper part 210.

The duct side part 220 may include a second duct side part 220*b*. The second duct side part 220*b* may form a shape extending in a downward direction from a second side of the duct upper part 210.

The first duct side part 220*a* and the second duct side part 220*b* may face each other. The duct side part 220 may indicate at least one of the first duct side part 220*a* or the second duct side part 220*b*.

When the forklift enters or is inserted into the duct 200, the duct side part 220 may be positioned on the side of the forklift. For example, when the forklift enters or is inserted into the duct hollow 205 corresponding to the inside of the duct 200, the forklift may be positioned between the first duct side part 220*a* and the second duct side part 220*b*.

The duct side part 220 can suppress the forklift positioned in the duct hollow 205 from moving to the first side or the second side. Accordingly, the duct side part 220 can protect the component 15 (see FIG. 4) from the forklift positioned in the duct hollow 205. In addition, since the duct side part 220 limits the horizontal movement of the forklift, the power conversion system 10 (see FIG. 2) can be stably loaded on the forklift through the duct side part 220.

The duct side part 220 may include a duct side plate 221. The duct side plate 221 may form a shape extending in a downward direction from one side of the duct upper plate 211. The duct side part 220 may include an opening formed in the duct side plate 221. For convenience of illustration, FIG. 8 does not show the opening formed in the duct side plate 221.

The duct upper part 210 and the duct side part 220 may form a hollow. For example, the duct hollow 205 may be formed by the duct upper part 210 and the duct side part 220. The duct hollow 205 may be a hollow formed in the duct 200. The duct hollow 205 may be open forward.

The duct side part 220 may include the board seating portion 223. The board seating portion 223 may be formed, positioned, or coupled to the duct side plate 221. The board seating portion 223 may include a concave groove which is concave toward the duct hollow 205. For example, the board seating portion 223 may form a duct groove 224 concave toward the duct hollow 205. The duct groove 224 may connect to or communicate with the duct hollow 205. The board seating portion 223 may form a shape protruding from the duct side plate 221 toward the outside of the duct 200.

The duct 200 may include a duct lower part 240. The duct lower part 240 may form the bottom surface of the duct 200. The duct lower part 240 may be coupled, attached, or fixed to the case 100 (see FIG. 3). When the entry opening 157

(see FIG. 6) is formed in the forklift opening 150 (see FIG. 6), at least a portion of the duct lower part 240 may be removed.

Therefore, when the forklift of the forklift truck moves from the bottom to the top of the entry opening 157 (see FIG. 6), the forklift may be positioned in the duct hollow 205 via the entry opening 157 (see FIG. 6). When the forklift moves further up, the duct upper part 210 may abut the forklift.

Figure 9:
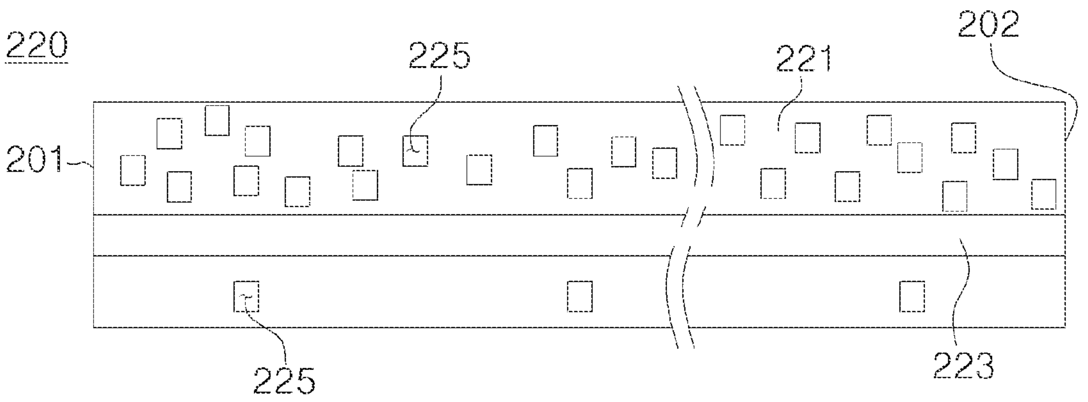
FIG. 9 illustrates an example of a duct of FIG. 7 when viewed from the side.
Figure 10:
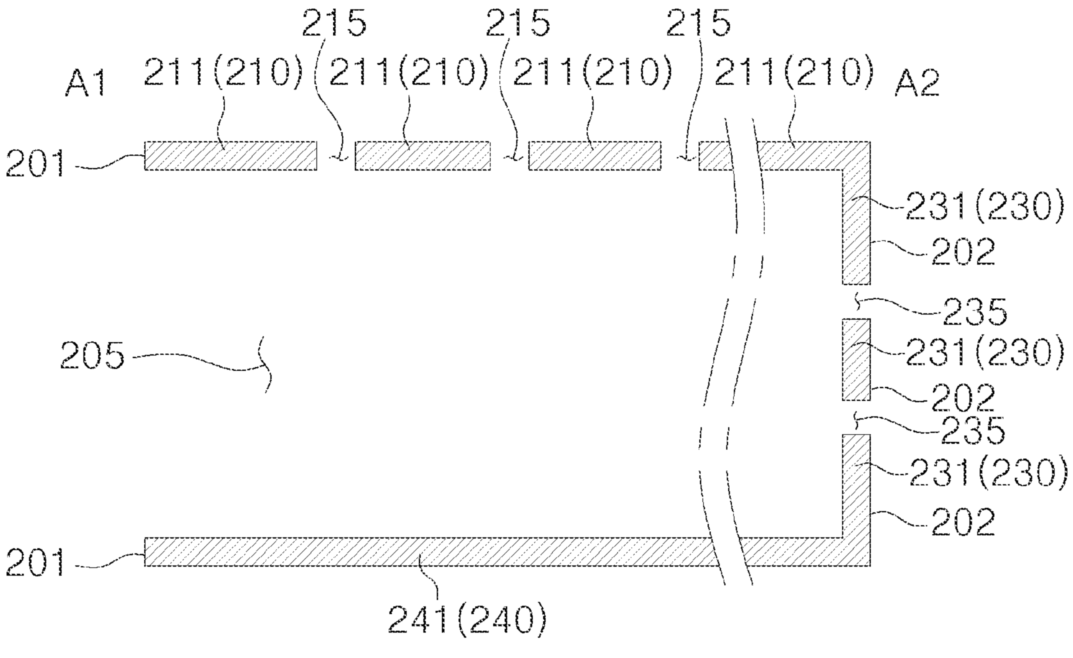
FIG. 10 is a cross-sectional view of an example of a duct of FIG. 7 taken along A1-A2.
Figure 11:
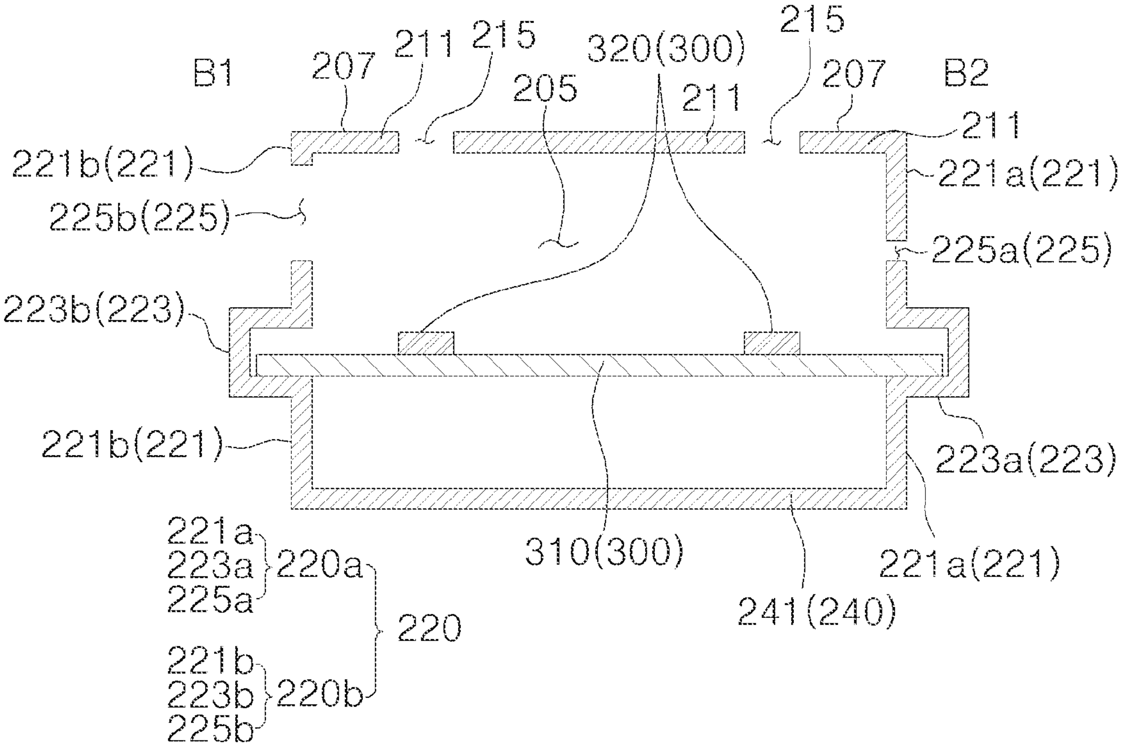
FIG. 11 is a cross-sectional view of an example of a duct of FIG. 7 taken along B1-B2.

FIG. 9 illustrates a duct of FIG. 7 when viewed from the side. FIG. 10 is a cross-sectional view of a duct of FIG. 7 taken along A1-A2. FIG. 11 is a cross-sectional view of a duct of FIG. 7 taken along B1-B2.

Referring to FIGS. 9 to 11, the duct side part 220 may include a duct side opening 225. The duct side opening 225 may be an opening formed in the duct side plate 211. The duct side opening 225 may be connected to an inner surface and an outer surface of the duct side plate 211. A plurality of duct side openings 225 may be provided. The duct side opening 225 may connect to or communicate with the duct hollow 205 and the accommodation space AS (see FIG. 3).

The duct 200 may include a duct rear part 230. The duct rear part 230 may form a rear face of the duct 200. The duct rear part 230 can suppress forward movement of the forklift positioned in the duct hollow 205.

The duct rear part 230 may include a duct rear plate 231. The duct rear plate 231 may form a shape extending in a downward direction from a rear end of the duct upper part 210.

The duct rear part 230 may include a duct rear opening 235. The duct rear opening 235 may be an opening formed in the duct rear plate 231. The duct rear opening 235 may be connected to a front face and a rear face of the duct rear plate 231. The duct rear opening 235 may connect to or communicate with the duct hollow 205 and the accommodation space AS (see FIG. 3).

The first duct side part 220*a* may include a first duct side plate 221*a* extending in a downward direction from the first side of the duct upper part 210. The second duct side part 220*b* may include a second duct side plate 221*b* extending in a downward direction from the second side of the duct upper part 210. The duct side plate 221 may indicate or include at least one of the first duct side plate 221*a* and the second duct side plate 221*b*.

The first duct side part 220*a* may include a first duct side opening 225*a* formed in the first duct side plate 221*a*. The second duct side part 220*b* may include a second duct side opening 225*b* formed in the second duct side plate 221*b*. The duct side opening 225 may indicate or include at least one of the first duct side opening 225*a* and the second duct side opening 225*b*.

The first duct side part 220*a* may include a first board seating portion 223*a* that is formed, connected, or coupled to the first duct side plate 221*a* and includes a concave groove which is concave toward the duct hollow 205. The second duct side part 220*b* may include a second board seating portion 223*b* that is formed, connected, or coupled to the second duct side plate 221*b* and is concave toward the duct hollow 205. The board seating portion 223 may indicate or include at least one of the first board seating portion 223*a* or the second board seating portion 223*b*.

Referring to FIGS. 1 to 11, the forklift of the forklift truck may be positioned in the duct hollow 205 via the forklift entry/exit unit 151. While the forklift truck moves the power conversion system 10, the load of the power conversion system 10 may be transferred to the forklift through the duct upper part 210.

After the movement of the power conversion system 10 is completed, the forklift may be separated from the duct 200. The third component 15*c* may be disposed in the duct groove 224 through the board entry/exit unit 153. The component 15 may include a board component 300. For example, the third component 15*c* may include the board component 300.

The board component 300 may include a board component body 310. The board component body 310 may be stably placed in the duct groove 224 through the board entry/exit unit 153. The board component body 310 may form a board shape. For example, the board component body 310 may include a printed circuit board (PCB).

After the board component 300 is stably placed in the duct groove 224, other components of the power conversion system 10 may be electrically connected to the board component 300. The board component 300 may include a board component terminal 320. The board component terminal 320 may be connected or coupled to the board component body 310. For example, the board component terminal 320 may be connected or coupled to one surface of the board component body 310. The board component terminal 320 may be electrically connected to other components of the power conversion system 10.

The forklift entry/exit unit 151 may connect to or communicate with the duct hollow 205. After the third component 15*c* is stably placed in the duct groove 224, a portion of air positioned in front of the power conversion system 10 may enter the inside of the case 100 through the forklift opening 150. For example, a portion of air positioned in front of the power conversion system 10 may enter the duct hollow 205 through the forklift opening 150.

The air entering the duct hollow 205 from the front of the power conversion system 10 may be discharged to the outside of the duct 200 through an opening formed in the duct 200. For example, the air positioned in the duct hollow 205 may be discharged to the accommodation space AS through at least one of the duct upper opening 215, the duct side opening 225, or the duct rear opening 235. The air discharged to the accommodation space AS may cool the plurality of components 15.

FIG. 12 illustrates an example of a gas flow path formed in a power conversion system based on an embodiment of the disclosed technology. In FIG. 12, the power conversion system when viewed from above may be observed in a state in which the upper surface of the case 100 (see FIG. 3) is removed.

Referring to FIGS. 1 to 12, a gas flow path GP may be formed in the power conversion system 10. A gas flowing in the gas flow path GP may be, for example, air. The gas flow path GP illustrated in FIG. 12 may indicate a portion of the flow path formed in the power conversion system 10.

The gas flow path GP may start at the front case 120. For example, a gas inlet GE may start at the forklift opening 150. The gas flow path GP may end at the fan 135. That is, the gas flow path GP may start at the forklift opening 150 and end at the fan 135.

The gas (air, etc.) introduced through the forklift opening 150 may pass through a plurality of openings formed in the duct 200 and be discharged to the outside of the duct 200. For example, a size of an opening formed in the duct side plate 221 facing the second component 15*b* in the duct side plate 221 may be greater than a size of an opening formed in the duct side plate 221 facing the side cases 115 and 117 in the duct side plate 221.

The arrangement of the plurality of components 15 may be considered based on the gas flow path GP. For example, the second component 15*b* may have a relatively large amount of heat generation compared to the other components 15. Air may flow in the gas flow path GP. While the air flows in the gas flow path GP, the components 15 and the air may heat-exchange. For example, the components 15 may provide heat to air. In this context, the gas flow path GP may be referred to as a "cooling flow path".

Only specific examples of implementations of certain embodiments are described. Variations, improvements and enhancements of the disclosed embodiments and other embodiments may be made based on the disclosure of this patent document.

What is claimed is:

1. A housing comprising:

a case structured to provide an accommodation space and including a front case forming a front face of the case; and a duct positioned in the accommodation space and facing the front case, the duct including a duct hollow that is open towards a forward direction, wherein the front case includes:

a front case body forming the front face of the case; and a forklift opening formed on the front case body and positioned in front of the duct, wherein the duct further includes:

a duct upper part disposed behind the forklift opening, the duct upper part including a duct upper plate extending rearward and forming an upper surface; and a duct side part including a duct side plate extending downward from a side of the duct upper part and a board seating portion positioned on the duct side plate and concave toward the duct hollow.

2. The housing of claim 1, wherein the duct side part includes a duct side opening formed on the duct side plate and communicating with the duct hollow and the accommodation space.

3. The housing of claim 1, wherein the duct upper part includes a duct upper opening formed in the duct upper plate and communicating with the duct hollow and the accommodation space.

4. The housing of claim 1, wherein the duct further includes a duct rear part including a duct rear plate forming a rear face of the duct.

5. The housing of claim 4, wherein the duct rear part includes a duct rear opening formed on the duct rear plate and communicating with the duct hollow and the accommodation space.

6. The housing of claim 1, wherein the board seating portion protrudes from the duct side plate to an outside of the duct.

7. The housing of claim 1, wherein the forklift opening includes:

a forklift entry and exit unit formed on the front case body and positioned in front of the duct hollow; and a board entry and exit unit formed on the front case body and positioned in front of the board seating portion.

8. The housing of claim 1, wherein the case further includes:

a rear case forming a rear face of the case; and a fan positioned in the rear case.

9. The housing of claim 1, wherein the duct side plate includes:

a first duct side plate extending downward from a first side of the duct upper plate; and a second duct side plate extending downward from a second side of the duct upper plate and facing the first duct side plate.

10. The housing of claim 9, wherein the board seating portion includes:

a first board seating portion positioned on the first duct side plate and concave toward the duct hollow; and a second board seating portion positioned on the second duct side plate and concave toward the duct hollow.

11. A power conversion system comprising:

a case structured to include an accommodation space and including a front case forming a front face of the case;

a duct positioned in the accommodation space and facing the front case, the duct including a duct hollow that is open towards a forward direction; and a component accommodated in at least one of the case or the duct, wherein the front case includes:

a front case body forming the front face of the case; and a forklift opening formed on the front case body and positioned in front of the duct, wherein the duct includes:

a duct upper part disposed behind the forklift opening, the duct upper part including a duct upper plate extending rearward and forming an upper surface; and a duct side part including a duct side plate extending downward from a side of the duct upper part and a board seating portion positioned on the duct side plate and concave toward the duct hollow.

12. The power conversion system of claim 11, wherein the component includes a board component detachably coupled to the board seating portion.

13. The power conversion system of claim 12, wherein the board component includes:

a board component body forming a board shape and detachably coupled to the board seating portion; and a board component terminal coupled to one surface of the board component body.

14. The power conversion system of claim 11, wherein the duct side part includes a duct side opening formed on the duct side plate and communicating with the duct hollow and the accommodation space.

15. The power conversion system of claim 11, wherein the duct further includes a duct rear part including a duct rear plate forming a rear face of the duct.

16. The power conversion system of claim 11, wherein the board seating portion forms a shape protruding from the duct side plate to an outside of the duct.

17. The power conversion system of claim 11, wherein the case further includes:

a rear case forming a rear face of the case; and a fan positioned in the rear case.

18. The power conversion system of claim 11, wherein the duct side plate includes:

a first duct side plate extending downward from a first side of the duct upper plate; and a second duct side plate extending downward from a second side of the duct upper plate and facing the first duct side plate.

19. The power conversion system of claim 18, wherein the board seating portion includes:

a first board seating portion positioned on the first duct side plate and concave toward the duct hollow; and a second board seating portion positioned on the second duct side plate and concave toward the duct hollow.

20. The power conversion system of claim 11, wherein the forklift opening includes a pair of forklift openings that are horizontally spaced apart from each other, and wherein the duct includes a pair of ducts respectively disposed behind the pair of forklift openings.

* * * * *